(12) United States Patent
Miller et al.

(10) Patent No.: US 8,338,803 B2
(45) Date of Patent: Dec. 25, 2012

(54) DEVICE FOR TESTING AN INTEGRATED CIRCUIT AND METHOD FOR IMPLEMENTING SAME

(75) Inventors: Florent Miller, Levallois (FR); Cécile Weulersse, Versailles (FR); Antonin Bougerol, Suresnes (FR); Thierry Carriere, Triel sur Seine (FR); Patrick Heins, Castelnau de Montmiral (FR); Samuel Hazo, Toulouse (FR)

(73) Assignee: European Aeronautic Defence and Space Company Eads France, Paris (FR)

( * ) Notice: Subject to any disclaimer, the term of this patent is extended or adjusted under 35 U.S.C. 154(b) by 0 days.

(21) Appl. No.: 13/140,409

(22) PCT Filed: Dec. 2, 2009

(86) PCT No.: PCT/FR2009/052377
§ 371 (c)(1),
(2), (4) Date: Sep. 16, 2011

(87) PCT Pub. No.: WO2010/076448
PCT Pub. Date: Jul. 8, 2010

(65) Prior Publication Data
US 2012/0001088 A1    Jan. 5, 2012

(30) Foreign Application Priority Data
Dec. 17, 2008 (FR) ..................... 08 58737

(51) Int. Cl.
*G01N 23/02* (2006.01)
*H01J 37/317* (2006.01)
*H01L 21/265* (2006.01)

(52) U.S. Cl. ............. 250/492.21; 250/492.2; 250/492.3; 250/251; 250/359.1; 324/71.3; 324/464; 365/208

(58) Field of Classification Search ................. 250/492, 250/21, 492.2, 492.3, 251, 359.1; 324/464, 324/71.3; 365/208
See application file for complete search history.

(56) References Cited

U.S. PATENT DOCUMENTS

| 5,850,145 A * | 12/1998 | Burroughs et al. ...... 324/750.14 |
| 2006/0256925 A1 | 11/2006 | Virshup et al. |

(Continued)

FOREIGN PATENT DOCUMENTS

JP    2008173298 A    7/2008

(Continued)

OTHER PUBLICATIONS

Duzellier et al. "Heavy Ion/Proton Test Results on High Integrated Memories", Radiation Effects Data Workshop, Jan. 1, 1993, pp. 36-42, IEEE, New York, New York.

(Continued)

*Primary Examiner* — Nikita Wells
(74) *Attorney, Agent, or Firm* — IM IP Law PLLC; C. Andrew Im (57) ABSTRACT

The invention relates to a device for testing an integrated circuit. The device comprises a plate for receiving and subjecting the integrated circuit to a test. The plate comprises a component for powering and operating the integrated circuit and another component for measuring the operation of the integrated circuit during the test. The device also comprises an irradiation device for subjecting the circuit to a proton bombardment and a mask with a variable thickness provided between a bombardment access region on the integrated circuit and an established zone of the integrated circuit.

9 Claims, 4 Drawing Sheets

U.S. PATENT DOCUMENTS

2010/0163756 A1* 7/2010 McPeak .................. 250/492.21
2011/0298332 A1* 12/2011 Miller et al. .................. 310/303

FOREIGN PATENT DOCUMENTS

WO     WO2007/119030 A     10/2007

OTHER PUBLICATIONS

Sakae et al., "Conformal irradiation by proton beam scanning and multilayer energy filter", Review of Scientific Instruments, vol. 74, No. 3, Mar. 1, 2003, pp. 1292-1295, American Institute of Physics, Melville, New York.

Ziock et al., "Tests of the Radiation Hardness of VLSI Integrated Circuits and Silicon Strip Detectors for the SSC Under Neutron, Proton, and Gamma Irradiation", IEEE Transaction on Nuclear Science, vol. 38, No. 2, Apr. 1, 1991, pp. 269-276, IEEE, New York, New York.

\* cited by examiner

DEVICE FOR TESTING AN INTEGRATED CIRCUIT AND METHOD FOR IMPLEMENTING SAME

RELATED APPLICATIONS

This application is a §371 application from PCT/FR2009/052377 filed Dec. 2, 2009, which claims priority from French Patent Application No. 08 58737 filed Dec. 17, 2008, each of which is herein incorporated by reference in its entirety.

TECHNICAL FILED OF THE INVENTION

The present invention relates to an integrated circuit testing device and its method of implementation. It concerns a device enabling to define the sensitivity of an electronic component in relation to the primary ionization of protons. The purpose of the invention is to overcome a part of the problems linked to the energy control of protons.

RELATED ART

In the state of the Art, a certain quantity of protons is known to exist in natural radiative environments, such as atmospheric, spatial or on the ground. Protons are particles that are able to interact with the constitutive matter of electronic components. Said interaction of the protons with the constitutive matter of the electronic components may provoke failure, referred to as "isolated events" when produced by the passage of a single particle.

The interaction of the protons with the constitutive matter of the electronic components is produced according to two mechanisms, the dangerousness of which depending on the energy level of the particle.

Figure 1A:
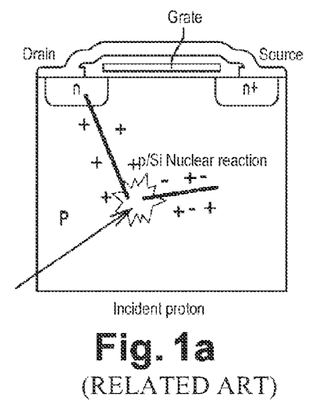
FIG. 1a-b: a schematic drawing of the proton's interactive mechanisms inside the silicon.

A first mechanism constitutes a nuclear interaction, such as illustrated in FIG. 1a. During a nuclear interaction, a proton presents a certain probability for interacting with a core of a target atom, thus provoking an emission of secondary particles. The probability of interaction between the core and the proton is relatively low; nevertheless, ionization due to the emission of secondary particles may provoke isolated events.

Figure 1B:
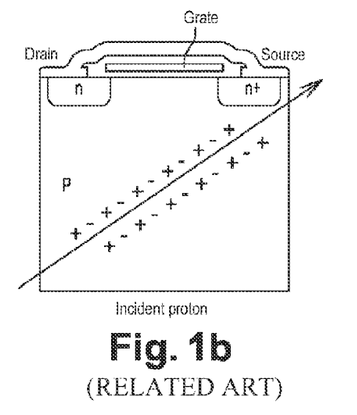
Figure 2:
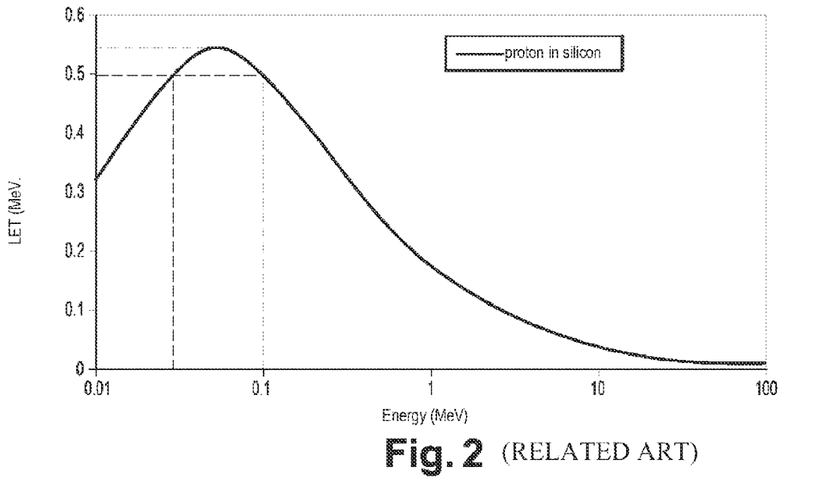
FIG. 2: a curve depicting the electronic stoppage capacity of a proton inside the silicon.

A second mechanism, such as illustrated in FIG. 1b, constitutes a coulombian reaction. In this case, the proton is a charged particle that is able, through coulombian interaction, to provoke ionization of the target atoms. Said mechanism is produced each time the proton passes into the constitutive matter of the components; nevertheless, the charge quantity generated by unit length (electronic stoppage capacity) is relatively low, only attaining its maximum for an energy nearing 0.055 MeV, for the silicon, such as shown in FIG. 2. Said position, for which the electronic stoppage capacity is at its maximum, is known by those skilled in the Art as the "Bragg peak". The Bragg peak energy value of a proton interaction with the matter varies depending on the target semi-conductor material. Next, although the invention's description will use the energy and electronic stoppage capacity values commonly found in the interaction of a proton with silicon, the invention is nevertheless applicable to all other semi-conductor materials, insofar as the curve type, such as presented in FIG. 2, can be obtained via known and available software: SRIM (www.srim.org).

FIG. 2 is thus a curve representing the electronic stoppage capacity of a proton in silicon. Said curve depicts the loss of energy per unit length via a proton's coulombian interaction in silicon. We thus note that the maximum of the curve is situated around 0.055 MeV for an electronic stoppage capacity corresponding to 0.538 MeV/cm2/mg. Said curve also illustrates that the value of the proton's electronic stoppage capacity rapidly declines when the energy of the proton increases.

Up until relatively recent technologies, namely etching with a resolution exceeding 130 nm, the only interaction mechanism of a proton combined with silicon and provoking a failure concerned the nuclear interaction. Nevertheless, recent studies, carried out, not only for simulation purposes, but also experimental, have demonstrated that the direct ionization mechanism of the protons could provoke isolated events in the most integrated components, such as shown in the experimental results achieved on an IBM 65 nm SOI (Silicon On Insulator) SRAM memory technology. The silicon on insulator (SOI) technology refers to the use of silicon-insulator layers for the purpose of enhancing performance, instead of the traditional silicon substrate used in the manufacture of semi-conductors.

The impact estimated on the default rate of said components is considerable, not only for the electronic components in the spatial field in particular, where the proton concentration is significant, but also in the atmosphere. Another aspect of this problem concerns the effect of the reinforcement of structures. Indeed, the protons lose a part of their energy before interacting with the component. The spectrum of the proton detected by the component can significantly differ from the nominal spectrum. Depending on the thickness and type of materials passed through before attaining the sensitive zone of the electronic component, the protons creating failure due to direct ionization may derive from very different initial energy ranges.

Figure 3:
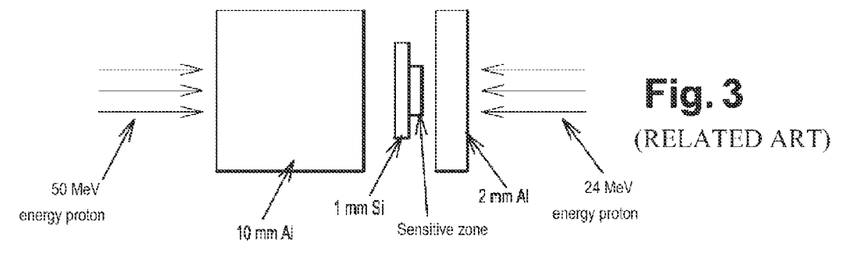
FIG. 3: a schematic drawing of the influence of a proton's path through aluminum according to its energy.

FIG. 3 shows a schematic drawing of the influence of a proton's path through aluminum according to its energy. For a proton that travels 10 mm through aluminum and 1 mm through silicon, this induces direct ionization-type interactions, which are potentially dangerous in a sensitive zone if the initial energy of the proton corresponds to 50 MeV. If the proton's energy is lower, the proton will be stopped inside the material. If its energy exceeds 50 MeV, its direct ionization will be poor. In other words, a proton that only passes through 2 mm of aluminum will be considered as being more dangerous if its energy is around 24 MeV.

In order to be able to quantify the number of failures expected for a given proton environment, it is important to have a means for characterizing the sensitivity of advanced technologies in relation to the direct ionization of protons. Nevertheless, characterizing the sensitivity of electronic components in relation to the direct ionization of protons is difficult, since the range of energies used for such phenomenon is difficult to implement on an experimental basis.

Indeed, in order to highlight the direct ionization phenomenon of the protons, the energy needs to be controlled with sufficient precision in order to enable the proton to benefit from energy nearing 0.055 MeV (i.e. for silicon, the rate being different for other semi-conductor materials) when reaching the sensitivity zone of the component. Is meant by "sensitivity zone of the component", a zone in which the charges deposited are efficiently collected and then subsequently used to trigger off component failure.

It is all the more difficult to study such direct ionization phenomenon of the protons, the more the plating layers, the case, the air layers between the component and the proton source provoke a modification of the proton energy.

Figure 4:
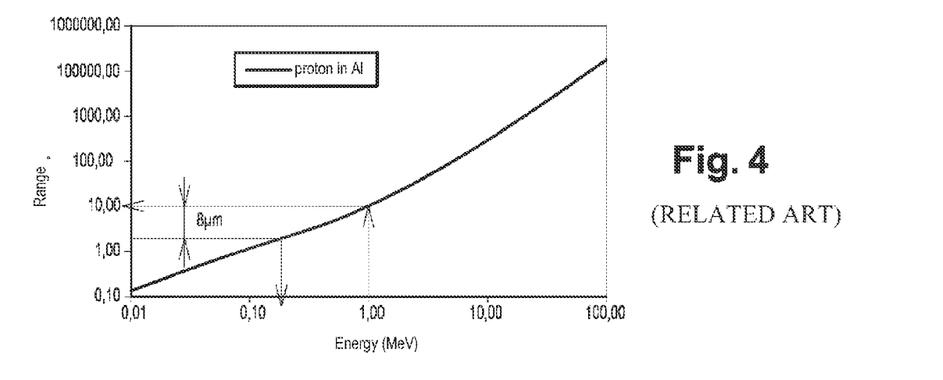
FIG. 4: a curve depicting the proton's path through aluminum according to its energy.

FIG. 4 shows a curve of a proton's path through a layer of aluminum according to its energy. For a 1 MeV incident proton, a layer of 8 μm aluminum provokes a reduction of 0.8 MeV in energy in the proton. Hence, without full knowledge of the different layers, i.e. their composition and their thickness separating a beam of incident protons in the sensitive zone of the component, it is difficult to adjust the energy of the proton in order to maximize ionization.

OBJECT AND SUMMARY OF THE INVENTION

The invention thus resolves such problem by proposing an integrated circuit testing device that enables to evaluate the sensitivity of a component in relation to the primary ionization of the protons, thereby overcoming the problems linked to the choice of incident energy.

In the invention, in order to resolve said problem, i.e. to be sure that a significant quantity of protons with 0.055 MeV in energy (energy position of the Bragg peak for silicon) attains the sensitive zone of the component, a mask, whose thickness is not uniform, is interposed between the latter and a bombardment device. In its thinnest parts, the low-energy protons of the incident radiation hit the component with a significant effect. In its thickest parts, only the highest-energy protons hit the component with a significant effect.

Such mask is either outside the electronic component or made up of the electronic component substrate.

Hence, the invention concerns an integrated circuit testing device, comprising,
  a panel receiving the integrated circuit and comprising components, thereby enabling its supply in electricity and measurement of its functioning during the test,
  an irradiation device to subject the circuit to a bombardment of protons,
  characterized in that it comprises a mask of variable thickness interposed between a bombardment access region on the integrated circuit and an established zone of the integrated circuit.

The invention further comprises one of the following characteristics:
  the mask is a beveled-shape mask with a bevel according to one or two dimensions;
  the beveled mask locally comprises at least one thickness and/or a type for which the residual energy of a proton in the region of the sensitivity zone, after having passed through said local thickness, is close to the energy position of the Bragg peak for interaction of the proton with the semi-conductor material of the integrated circuit;
  the beveled mask comprises one thickness in a single place, for which the residual energy of a proton in the region of the sensitivity zone exceeds the energy position of the Bragg peak for interaction of the proton with the semi-conductor material of the integrated circuit, and one thickness in another place for which the energy of an incident proton is totally absorbed;
  the mask is formed using a part to be added onto the integrated circuit or into a substrate body of the integrated circuit itself;
  the integrated circuit is set on the plate via a front side corresponding to the established zone and with a rear side corresponding to the substrate, placed opposite the established zone, facing the bombardment;
  the irradiation device comprises a proton accelerator.

It also concerns an integrated circuit testing method comprising the following operations:
  the integrated circuit to be tested is placed on a test plate in order to connect it to the power supply and to make it work,
  the integrated circuit to be tested is subjected to a bombardment of protons during the test,
  a mask of variable thickness is interposed between a bombardment access region on the integrated circuit and an established zone of the integrated circuit,
  the functioning of the integrated circuit is measured during the test.

The invention further comprises any one of the following operations:
  a cartography of the sensitive zone of the integrated circuit to be tested is recorded by installing a localized failure injection system,
  said cartography producing a correspondence between the logical addresses inside the integrated circuit and the geographical addresses inside said integrated circuit,
  the logical addresses sustaining failure due to said bombardment are identified by measuring the functioning of the integrated circuit during the bombardment test,
  the geographic positioning of the failure due to said bombardment is deduced by way of the cartography,
  the thickness of the mask is measured at the geographic positioning of the failure due to said bombardment,
  the thickness having produced the failure is deduced and thus the characterization of the sensitivity to the direct ionization of protons.

BRIEF DESCRIPTION OF THE DRAWINGS

The invention will be better understood after reading the following description and studying the figures included herein. These are only shown as examples and should not be considered as complete with regard to the invention. The figures show.

DETAILED DESCRIPTION OF THE EMBODIMENTS

Figure 5:
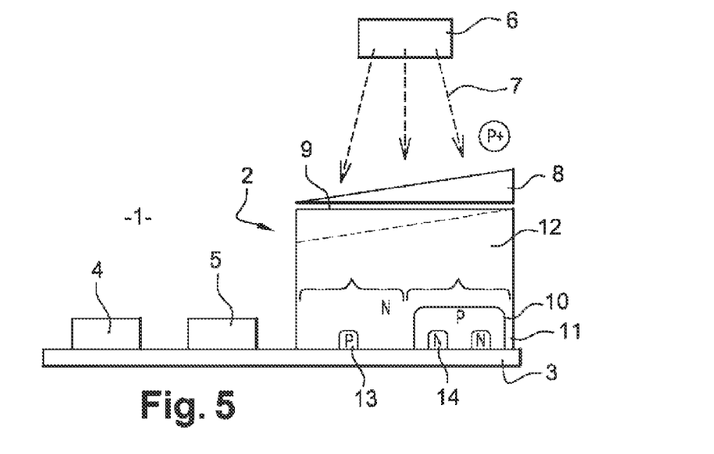
FIG. 5: a schematic drawing of the testing device according to the invention.

FIG. 5 is a schematic drawing of the integrated circuit 2 testing device 1 according to the invention. Said integrated circuit 2, roughly enlarged, is an electronic component mounted onto a plate 3 in order to be subjected to a series of reliability tests. This plate 3 comprises circuits 4 for powering and triggering off the integrated circuit 2. The plate 3 further comprises circuits 5 for measuring the proper running of the integrated circuit 2 during the test.

The device 1 comprises, for testing purposes, an irradiation device 6 in order to subject the circuit 2 to a bombardment of protons 7.

Nevertheless, it is difficult to highlight the direct ionization phenomenon of the protons 7 with the radiant irradiation device 6. With the proton 7 bombardment performed on the circuit 2, it is necessary to be able to sufficiently and precisely control the energy emitted so that the proton 7 benefits from energy nearing the energy position of the Bragg peak (0.055 MeV for silicon) when it attains the sensitivity zone 11 of the component. Indeed, the maximum electronic stoppage capacity of a proton inside the silicon is situated around 0.055 MeV.

In order to resolve this problem, the invention proposes the addition of a mask 8 of variable thickness, interposed between a bombardment access region on the circuit 2 and an established zone 10 of the circuit 2. The circuit 2 is set on the plate 3 via a front side corresponding to the established zone 10 and with a rear side 9 corresponding to the substrate 12, placed opposite the established zone, facing the bombardment. Said established zone 10 is the functional zone of the circuit 2; it is thus a sensitive zone.

In order to carry out the tests, the package of the circuit 2 is preferably open on its rear side 9, i.e. the side opposite the sensitive zones 11, so that the protons only have to pass through the substrate and not the layers of plating of unknown type.

The circuit 2 may comprise, inside a package, a substrate 12 made of semi-conductor material, for example in type n or p silicon, wherein is implanted a type n casing 10 de for type p substrates, or vice versa. The substrate 12 comprises at least one diffusion region 13 inside the type p substrate 12 when the substrate 12 is of type n and vice versa. Like the substrate 12, the casing may comprise type n or type p diffusion regions 14, depending on the kind of casing. Such arrangements lead to the creation of diodes and/or transistors and/or thyristors, very sensitive to the ionization effects and which define the sensitive zones 11 of the component in relation to its effects.

The invention is illustrated here for Silicon technology components, even though it is quite possible to apply it to other semi-conductor materials of the SiC or GaN types, amongst others.

Figure 6A:
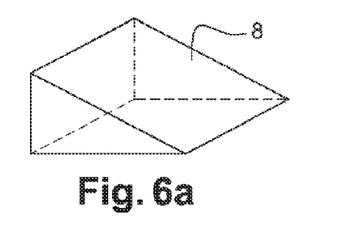
FIG. 6a-b: a schematic drawing of the mask type according to the invention.
Figure 6B:
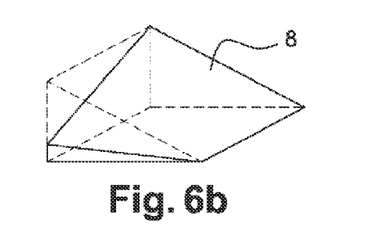

In the invention, the mask 8 is of beveled-shape with a bevel according to one or two dimensions, such as respectively illustrated in FIGS. 6a and 6b. The mask is illustrated here as being superposed.

In a preferred embodiment of the invention, the substrate 12 of the semi-conductor material is thinned down in order to form the mask 8. In such a case, the mask results from the substrate's local reduction in thickness. Thinning down may be achieved mechanically. Such thinning-down adopts a slanting angle, so that the residual thickness of the substrate varies across the surface of the circuit 2. Such mechanical thinning should not lead to destruction of the circuit 2, in for it to be able to remain functional for the same range of tensions, frequencies and temperatures as prior to the thinning.

Figure 7:
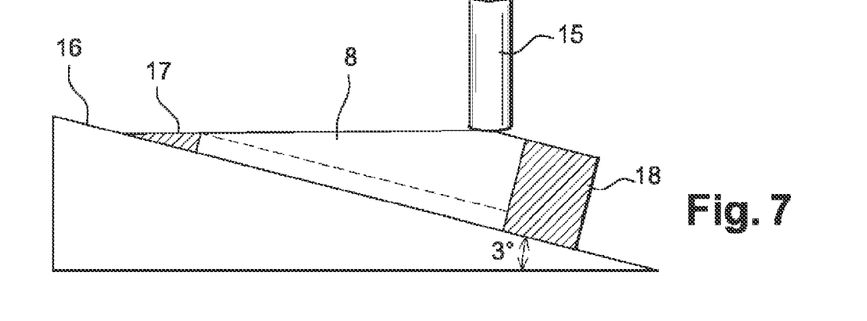
FIG. 7: a schematic drawing of the means for mechanically thinning a mask or a substrate according to the invention.

FIG. 7 shows that the mask 8 is formed using a tool 15, for example a grinding tool, inside a part to be added onto the integrated circuit 2 or into a substrate 12 body of the integrated 2 circuit itself. Hence, the mask 8 or the substrate 12 body are maintained on a slope 16 during grinding using wedges 17, 18. The slope 16 of the bevel is all the more steep, the smaller the integrated circuit 2 to be tested. The aim is to obtain varying thickness corresponding to the energy spectrum of the proton bombardments to be qualified. At an energy E, thickness should be great M (so as to only let through or produce protons whose energy is near to the energy position of the Bragg peak), whereas at a lower energy e, thickness should be low m for the same purpose. As regards the dimension of the component, the thickness should pass from M to m.

Figure 8:
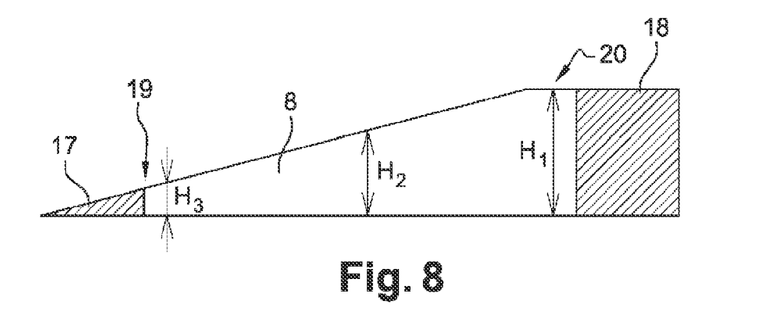
FIG. 8: a schematic drawing of the mask according to the invention.

FIG. 8 illustrates such a part to be added onto the circuit 2, tested after thinning The thickness of the semi-conductor material is measured by analyzing, for example, the reflection for a wave-length whereby the semi-conductor material fails to or hardly absorbs the laser beam on the front side and on the rear side, at different points on the circuit 2. Other methods may also be implemented, such as optically measuring the thickness of the component by observing its section, or by measuring mechanically.

When the protons create an impact on the circuit 2 following the bombardment, they pass through, depending on the entry points on the surface of the mask or the beveled substrate, differing thicknesses of silicon.

In an embodiment example of the invention, if an incident proton is considered with 5 MeV of energy and a mask 8 or substrate 12, with a residual thickness H3 equivalent to 100 μm on an edge 19 and a thickness H1 equal to 250 μm on an opposite edge 20, then the incident proton 7 will only pass through the silicon up until the sensitive zone 11. When a proton 7 creates an impact on the edge 19, the residual energy in the sensitive zone 11 is approximately 3 MeV. When a proton 7 creates an impact on the edge 20, the energy of the proton is thus absorbed within the silicon prior to attaining the sensitive zones 11.

Insofar as the silicon is thinned in a beveled shape, the mask or the beveled substrate locally comprises at least one thickness and/or one type (Aluminum, Iron, etc.) for which the residual energy of a proton 7, for 5 MeV in incident energy, for example, after having passed through such local thickness, is near to the Bragg peak energy position, i.e. 0.055 MeV.

The mask 8 or the beveled substrate comprises one thickness in a single place, for which the residual energy of a proton 7 exceeds 0.055 MeV and one thickness in another place for which the energy of an incident proton 7 is totally absorbed. This means that the path of the incident proton must be comprised between the thickness of the thinnest edge 19 and the thickness of the thickest edge 20 of the substrate.

The irradiation device preferably comprises a proton 7 accelerator. The tests carried out using the device 6 on the circuit 2 highlights, for certain proton impacts, failure due to the primary ionization of the protons. For other proton impacts, failure is due to the proton nuclear interaction on silicon.

In order to differentiate these two types of interaction, it is necessary to verify the occurrence of events. For example, in the case of a memory zone, cells, for which the residual thickness of silicon is such that the energy of the protons 7, after passing through the silicon, is located within the preferential primary ionization domain, have an occurrence of events far more significant than the other cells.

After passing through the mask, the protons may sustain a slight deviation. Hence, in a preferred embodiment of the invention, the mask is positioned very close to the electronic component (which is already the case when the mask is constituted by substrate from the electronic component).

Figure 9:
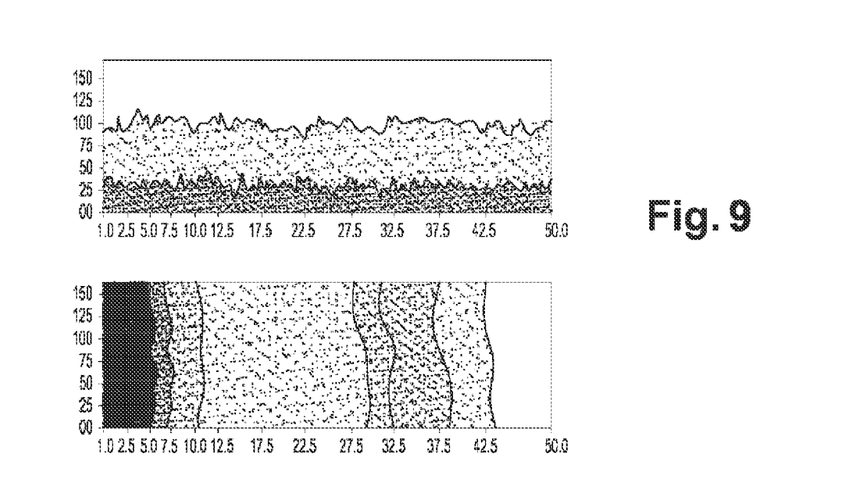
FIG. 9: a laser cartography illustrating the correspondence between a physical position and a logical address for the bits of a SRAM memory.

In order to validate the results of the test and to estimate the real energy of the protons 7 for each bit identified erroneously, correspondence between the logical addresses of the erroneous bits, inside a component's memory, and the physical position on the surface of the circuit is necessary, possibly determined by way of a failure injection tool, notably using a laser. Hence, a laser cartography (FIG. 9) of the sensitive zones 11 of the circuit 2 is predefined, thereby enabling to record the sensitive zones 11 with an injection of charge for each bit of the component. The physical position on the surface of the circuit is identified and possibly correlated to a measurement of the silicon's residual thickness. It is thus possible, via said laser cartography, to work back, for each error observed under a proton beam, to the energy of the proton provoking the failure. This enables to identify the proportion of the events triggered off by the primary ionization of the protons. Such logical/physical and correlation correspondence methodology with a thickness may be applied to each structure of the regular logical cells, such as memories and FPGAs. The example given in FIG. 9 is applied to a SRAM memory, though does not at all prevent the use of the method with other components.

Other methods for determining the logical/physical correspondence may be implemented, for example, by using the failure injection method by way of particles (heavy ions, protons), by using micro-beams or by delimiting the zones of interest with a screen, or even by using electromagnetic waves to inject the failures, or furthermore by directly using data supplied by the component manufacturer.

Figure 10:
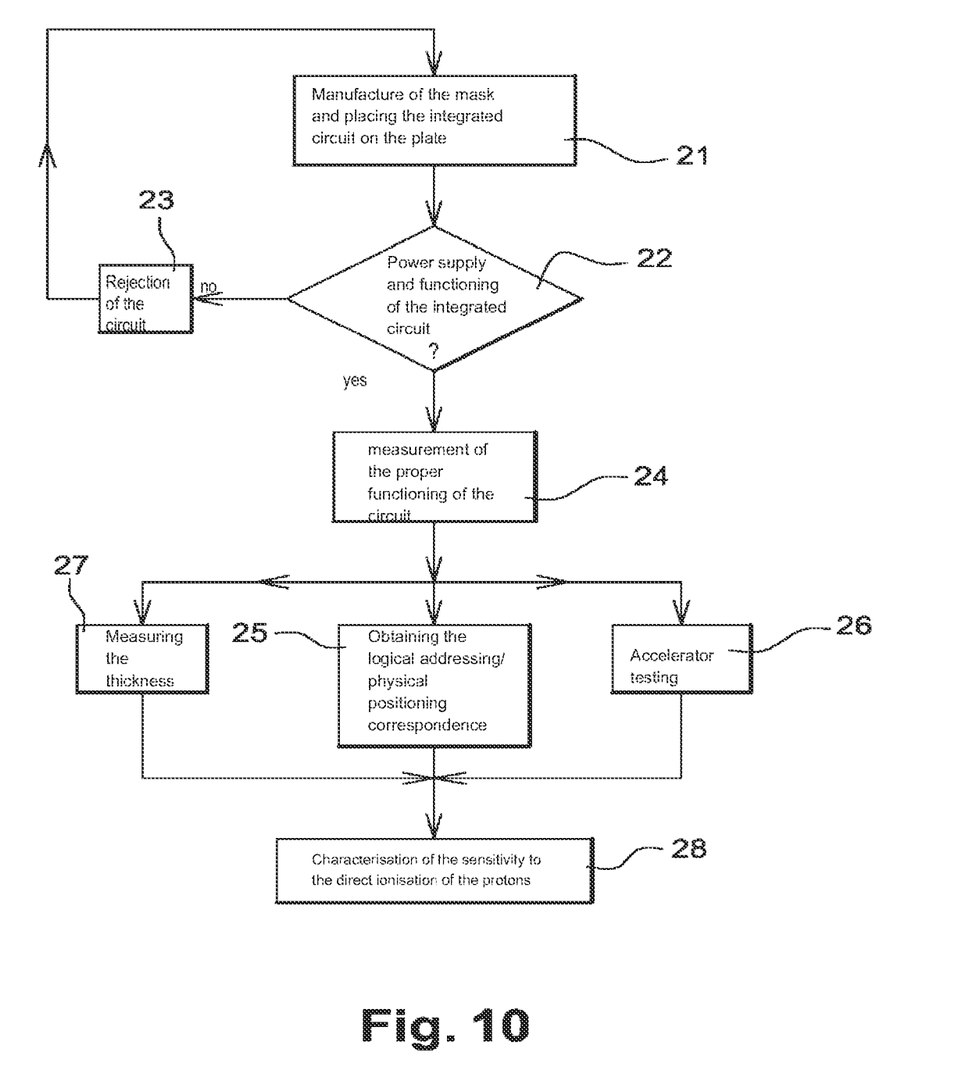
FIG. 10: a functional drawing of the method according to the invention.

FIG. 10 is a functional diagram of the method according to the invention. An operating mode organizes the succession of said operations according to the following mode. Said diagram illustrates the preliminary operation 21 in which the integrated circuit 2 to be tested is placed on a test plate 3. The circuit is placed on the plate with a mask 8 or a substrate 12 having first undergone a thinning process. Said mask 8 or substrate 12 of variable thickness is interposed between a bombardment access region on the integrated circuit 2 and an established zone of the integrated circuit 2. When the integrated circuit 2 is placed on the plate 3, it is then possible to carry out the operation 22.

During the operation 22, the integrated circuit 2 is powered and turned on by way of the plate 3, programmed for various power tensions and possible temperatures and frequencies. When the integrated circuit 2 is not running, it is then possible to carry out the operation 23; otherwise the operation 24 can be initiated.

During the operation 23, the circuit 2 is rejected for reasons of failure; then the operation 21 is repeated using a new circuit 2.

During the operation 24, the functioning of the integrated circuit 2 is measured during the test.

During the operation 25, either the manufacturer of the component has supplied the correspondence data between the spatial position of the sensitivity zones 11 and their logical position, or a cartography of the sensitive zone 11 of the integrated circuit to be tested is recorded by way of the failure injection means. The laser may be a means of failure injection, but it is not the sole means to obtain it. Said cartography produces a correspondence between the logical addresses in the integrated circuit, for example I, c, for an intersection between a line and a column of the component's memory, and the geographical addresses x, y of the position on the surface of the integrated circuit at the point of impact of the means of failure injection having provoked failure of said cell I, c. Said correspondence is then used to find out where (at point x, y) the protons actually hit the component (at logical address I, c) with a sensitive effect. Said x, y position itself is in relation with a thickness of the mask.

During operation 26, the integrated circuit 2 to be tested is subjected to a bombardment of protons during the test. Measuring the functioning of the integrated circuit during the bombardment test enables to identify the functional part of the integrated circuit that sustained failure due to said bombardment; a geographical address of the geographical position of the failure due to said bombardment is thus deduced by way of the cartography.

During the operation 27, the thickness of the mask is measured in different places on the integrated circuit.

When the operations 25, 26, 27 have been carried out, it is then possible to carry out operation 28.

During operation 28, the thickness having produced the failure is deduced and thus the characterization of the sensitivity of the protons to the direct ionization.

The invention claimed is:

1. An integrated circuit testing device, comprising:
   a plate receiving an integrated circuit and comprising a first component to supply electricity to the integrated circuit during a test and a second component to measure functioning of the integrated circuit during the test;
   an irradiation device to subject the integrated circuit to a bombardment of protons; and
   a mask of variable thickness interposed between a bombardment access region on the integrated circuit and an established zone of the integrated circuit.

2. The device of claim 1, wherein the mask is a beveled-shape mask with a bevel according to one or two dimensions.

3. The device of claim 2, wherein the beveled-shape mask comprises at least one thickness or a type for which the residual energy of a proton in the region of a sensitivity zone of the integrated circuit, after having passed through said at least one thickness, is close to the energy position of a Bragg peak for interaction of the proton with the semiconductor material of the integrated circuit.

4. The device of claim 3, wherein the bevel-shape mask comprises one thickness in a single place, for which the residual energy of a proton in the region of the sensitivity zone exceeds the energy position of the Bragg peak for interaction of the proton with the semiconductor material of the integrated circuit, and one thickness in another place for which the energy of a incident proton is totally absorbed.

5. The device of 1, wherein the mask is formed using a part to be added onto the integrated circuit or into a substrate body of the integrated circuit itself.

6. The device of claim 1, wherein the integrated circuit is set on the plate via a front side corresponding to the established zone and with a rear side corresponding to a substrate of the integrated circuit, placed opposite the established zone, facing the bombardment.

7. The device of claim 1, wherein the irradiation device comprises a proton accelerator.

8. An integrated circuit testing method comprising the steps of:
   placing an integrated circuit to be tested on a test plate in order to connect the integrated circuit to a power supply and operate the integrated circuit;
   subjecting the integrated circuit to be tested to a bombardment of protons during a test;
   interposing a mask of variable thickness between a bombardment access region on the integrated circuit and an established zone of the integrated circuit; and
   measuring functioning of the integrated circuit during the test.

9. The method of claim 8, further comprising the steps of:
   recording a cartography of a sensitive zone of the integrated circuit to be tested by installing a localized failure injection system;
   producing a correspondence between logical and geographical addresses of the integrated circuit by said cartography;
   identifying the logical addresses sustaining failure due to the bombardment of protons by measuring the functioning of the integrated circuit during the test;

determining a geographic positioning of the failure due to the bombardment of protons by utilizing said cartography;

measuring thickness of the mask at the geographic positioning of the failure due to the bombardment of protons; and determining a sensitivity characterization of the integrated circuit to direct ionization of protons according to the thickness of the mask producing the failure.

* * * * *